(12) United States Patent
Hwang et al.

(10) Patent No.: US 8,183,673 B2
(45) Date of Patent: May 22, 2012

(54) THROUGH-SILICON VIA STRUCTURES PROVIDING REDUCED SOLDER SPREADING AND METHODS OF FABRICATING THE SAME

(75) Inventors: Son-Kwan Hwang, Gyeonggi-do (KR); Keum-Hee Ma, Gyeongsangbuk-do (KR); Seung-Woo Shin, Gyeonggi-do (KR); Min-Seung Yoon, Seoul (KR); Jong-Ho Yun, Gyeonggi-do (KR); Ui-Hyoung Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 252 days.

(21) Appl. No.: 12/565,969

(22) Filed: Sep. 24, 2009

(65) Prior Publication Data

US 2010/0096753 A1    Apr. 22, 2010

(30) Foreign Application Priority Data

Oct. 21, 2008  (KR) .................. 10-2008-0102948
Nov. 26, 2008  (KR) .................. 10-2008-0117780

(51) Int. Cl.
*H01L 23/495* (2006.01)

(52) U.S. Cl. ......... 257/675; 257/686; 257/777; 438/109

(58) Field of Classification Search .................. 257/675, 257/686, 777; 438/109, 639
See application file for complete search history.

(56) References Cited

U.S. PATENT DOCUMENTS

| | | | |
|---|---|---|---|
| 6,501,176 B2 | 12/2002 | Jackson | |
| 6,582,992 B2 * | 6/2003 | Poo et al. | 438/109 |
| 6,841,883 B1 * | 1/2005 | Farnworth et al. | 257/777 |
| 6,998,717 B2 * | 2/2006 | Farnworth et al. | 257/777 |
| 7,795,139 B2 * | 9/2010 | Han et al. | 438/639 |
| 7,868,462 B2 * | 1/2011 | Choi et al. | 257/777 |
| 2003/0107119 A1 * | 6/2003 | Kim | 257/686 |
| 2008/0017968 A1 | 1/2008 | Choi et al. | |
| 2008/0083976 A1 * | 4/2008 | Haba et al. | 257/686 |
| 2009/0039481 A1 * | 2/2009 | Park | 257/673 |

FOREIGN PATENT DOCUMENTS

| | | |
|---|---|---|
| JP | 2001-135785 | 5/2001 |
| KR | 1020050060741 | 6/2005 |
| KR | 1020060007682 | 1/2006 |
| KR | 10-0842916 | 6/2008 |

\* cited by examiner

*Primary Examiner* — Howard Weiss
*Assistant Examiner* — Steven Rao
(74) *Attorney, Agent, or Firm* — Myers Bigel Sibley & Sajovec, P.A.

(57) ABSTRACT

A microelectronic device structure as provided herein includes a conductive via having a body portion extending into a substrate from an upper surface thereof and a connecting portion laterally extending along the upper surface of the substrate. The connecting portion includes a recess therein opposite the upper surface of the substrate. The recess is confined within the connecting portion of the conductive via and does not extend beneath the upper surface of the substrate. A microelectronic device structure is also provided that includes a conductive via having a body portion extending into a substrate from an upper surface thereof and an end portion below the upper surface of the substrate. The end portion has a greater width than that of the body portion. A solder wettable layer is provided on the end portion. The solder wettable layer is formed of a material having a greater wettability with a conductive metal than that of the end portion of conductive via. Related methods of fabrication are also discussed.

30 Claims, 9 Drawing Sheets

THROUGH-SILICON VIA STRUCTURES PROVIDING REDUCED SOLDER SPREADING AND METHODS OF FABRICATING THE SAME

CROSS REFERENCE TO RELATED APPLICATIONS

This application claims priority from Korean Patent Application Nos. 2008-0102948 filed on Oct. 21, 2008, and 2008-0117780 filed on Nov. 26, 2008, in the Korean Intellectual Property Office, the disclosures of which are incorporated by reference herein in their entireties.

FIELD OF THE INVENTION

The present invention relates to the field of microelectronic devices in general, and more particularly, to interconnection structures for microelectronic devices and related fabrication methods.

BACKGROUND

As device speeds and device integration increase, signal delays may also be increased, for example, due to parasitic capacitance introduced by interconnection structures. Advances in integration technology have led to the development of three-dimensional integration, where wafers may be stacked three-dimensionally, in contrast to the conventional two-dimensional approach. In a three-dimensional wafer stack package (WSP), a technique called through-silicon via (TSV) can be used to extend the via hole through a substrate so that a conductive via may be formed to vertically extend and completely penetrate through the substrate. Such a TSV structure may provide higher speeds, higher integration, and improved functionality in comparison to a long wire pattern interconnection. Multiple substrates including TSVs can be stacked on one another to achieve three-dimensional integration. In particular, the TSVs of different substrates can conduct signals from one substrate to another without the use of, for example, wires. Three-dimensional integration is usually performed after device passivation.

A TSV structure may be formed by forming an opening or hole in a substrate, such as a silicon substrate. An insulation layer, such as silicon dioxide ($SiO_2$), may be formed on the substrate and in the opening, and a barrier or seed layer, such as titanium nitride (TiN), may be formed on the insulation layer. A conductive metal layer, such as a copper layer (Cu), may be formed in the opening, for example, by a plating process or deposition process. A support attachment may also be formed on the conductive metal layer extending along the surface of the substrate. A backside of the substrate may then be recessed to expose at least a portion of the conductive metal layer, thereby forming a conductive via extending through the substrate. The substrate may then be diced, stacked on other substrates, and molded to provide a three-dimensional wafer stack package.

Two approaches that can be used in the formation of TSV structures include a "via first" approach, and a "via last" approach. According to the via first approach, TSVs may be formed through the substrate before back end processing. Subsequently, the substrate can be thinned and bound together with other substrates to provide a three dimensional stack structure. Alternatively, according to the via last approach, the via can be formed through the substrate after the backend processing or after a bonding process. TSV structures are also discussed in, for example, Korean Patent Application No. 10-2005-060741, U.S. Patent Application Publication No. 2008/0017968, and U.S. Pat. No. 6,501,176.

SUMMARY

According to some embodiments of the present invention, a microelectronic device structure includes a substrate and a conductive via having a body portion extending into the substrate from an upper surface thereof and a connecting portion laterally extending along the upper surface of the substrate. The connecting portion includes a recess therein opposite the upper surface of the substrate. The recess is confined within the connecting portion of the conductive via and does not extend beneath the upper surface of the substrate.

In some embodiments, the recess may extend into the connecting portion of the conductive via to a depth of about 5 micrometers ($\mu m$) to about 30 $\mu m$.

In other embodiments, the structure may include a conductive metal in the recess. The conductive metal may be formed of a material having a ductility greater than that of the conductive via. The recess may define an opening that is wider than, narrower than, or the same width as an opening in the substrate through which the body portion of the conductive via extends. The recess in the conductive via may have a substantially cylindrical shape or a spherical cap shape in some embodiments.

In other embodiments, the body portion may extend through the substrate and may include a protrusion that protrudes from a lower surface of the substrate opposite the upper surface. The structure may further include a metal layer on the protrusion. The metal layer may be formed of a material having a greater wettability with solder than that of the protrusion. For example, the metal layer may be tin (Sn), nickel (Ni), Copper (Cu) and/or silver (Ag).

In some embodiments, the protrusion may define a spherical shape having a diameter greater than that of the body portion.

In other embodiments, the conductive via may be a first conductive via extending into a first substrate. The structure may further include a second conductive via including a second body portion extending through a second substrate from an upper surface thereof to a lower surface thereof opposite the upper surface. The second body portion may protrude from the lower surface of the second substrate to contact the conductive metal in the recess in the first conductive via. The first conductive via may further include a barrier portion on a surface of the connecting portion outside of the recess, such that the conductive metal in the recess may extend outside of the recess but may not extend beyond the barrier portion when in contact with the second body portion of the second conductive via. The second body portion of the second conductive via may have a width that is smaller than, greater than, or equal to that of the recess in the first conductive via. In some embodiments, the second body portion of the second conductive via may extend at least partially into the recess into the first conductive via.

In some embodiments, the structure including the first and second substrates may be embodied in a multi-chip module, memory card, and/or other system. The system may further include a processor, an input/output device, and a bus configured to provide communication therebetween. The multi-chip module may include a module substrate configured to be electrically connected with other devices by solder bumps.

According to other embodiments of the present invention, a microelectronic device structure includes a substrate and a conductive via having a body portion extending into the substrate from an upper surface thereof and an end portion below the upper surface of the substrate. The end portion has a greater width than the body portion. A solder wettable layer is provided on the end portion. The solder wettable layer is formed of a material having a greater wettability with a conductive metal than that of the end portion of the conductive via.

In some embodiments, a conductive via may extend through the substrate such that the end portion defines a protrusion that protrudes from a lower surface of the substrate opposite the upper surface of the substrate. The conductive metal may be provided on the protrusion of the conductive via. The conductive metal may have a ductility greater than that of the conductive via.

In some embodiments, the structure may further include a second conductive via on the conductive metal opposite the protrusion of the first conductive via. The second conductive via may include a second body portion extending through a second substrate. The solder wettable layer may be formed of a material that provides a greater degree of wetting with the conductive metal than that of the second conductive via. The solder wettable layer may be tin (Sn), tin silver (SnAg), tin silver copper (SnAgCu) and/or tin bismuth (SnBi).

In other embodiments, the protrusion of the first conductive via may have a greater surface area than a portion of the second conductive via in contact with the conductive metal.

In some embodiments, the end portion of the conductive via may define a truncated spherical shape having a greater diameter than that of the body portion of the body portion of the conductive via.

In other embodiments, the conductive via may further include a connecting portion opposite the end portion that laterally extends along the upper surface of the substrate. The connecting portion may include a recess therein opposite the upper surface of the substrate. A conductive metal may be provided in the recess. The conductive metal may have a ductility greater that that of the conductive via.

In some embodiments, the recess may be confined within the connecting portion of the conductive via, and may not extend beneath the upper surface of the substrate. In other embodiments, the recess in the connecting portion of the conductive via may further extend into the body portion of the conductive via beyond the upper surface of the substrate.

According to further embodiments of the present invention, in a method of fabricating a microelectronic device, a conductive via is formed in the substrate. The conductive via includes a body portion extending into the substrate from an upper surface thereof, and a connecting portion laterally extending along the upper surface of the substrate. The connecting portion includes a recess therein opposite the upper surface of the substrate. The recess is confined within the connecting portion of the conductive via and does not extend beneath the upper surface of the substrate.

In some embodiments, a conductive metal may be formed in the recess. The conductive metal may be formed of a material having a ductility greater than that of the conductive via.

In other embodiments, to form the conductive via, an opening may be formed in the substrate. A conductive layer may be formed in the opening along opposing sidewalls thereof to define the conductive via including the body portion in the opening and the connecting portion extending along the upper surface of the substrate. A mask may be formed on the connecting portion of the conductive via, and the connecting portion of the conductive via may be etched using the mask to define the recess therein. The recess may extend into the connecting portion of the conductive via to a depth of about 5 micrometers (μm) to about 30 μm. The recess may define an opening in the connecting portion that is wider, narrower, or equal to that of the opening of the substrate through which the body portion extends.

In some embodiments, a barrier portion may be formed on a surface of the connecting portion outside of the recess. The barrier portion may be configured to prevent a conductive metal in the recess from extending beyond the barrier portion.

In other embodiments, in forming the conductive via, a metal layer may be formed in the opening in the substrate prior to forming the conductive layer therein. The metal layer may be formed of a material having a greater wettability to solder than that of the conductive layer.

In some embodiments, a second substrate may be assembled on the first substrate. The second substrate may include a second conductive via extending therethrough from an upper surface thereof to a lower surface thereof. The second conductive via may protrude from the lower surface of the second substrate to contact the conductive metal in the recess in the first conductive via.

According to still further embodiments of the present invention, in a method of fabricating a microelectronic device, a conductive via may be formed in a substrate. The conductive via may include a body portion extending into the substrate from an upper surface thereof and an end portion below the upper surface of the substrate. The end portion may have a greater width than that of the body portion. A solder wettable layer may be formed on the end portion. The solder wettable layer may be formed of a material having a greater wettability with a conductive metal than that of the end portion.

In some embodiments, a lower surface of the substrate opposite the upper surface may be removed such that the end portion of the conductive via including the solder wettable layer thereon protrudes from the lower surface of the substrate. The conductive metal may be formed on the end portion of the conductive via. The conductive metal may have a ductility greater than that of the conductive via.

In other embodiments, in forming the conductive via, an opening including opposing sidewalls and a surface therebetween may be formed in a substrate, and the solder wettable layer may be formed in the opening along the opposing sidewalls and the surface therebetween. A conductive layer may be formed on the solder wettable layer in the opening. The opening may be formed such that the surface of the opening between the opposing sidewalls defines a truncated spherical shape having a greater diameter than portions of the opening between the opposing sidewalls.

In other embodiments, the conductive metal may be formed on a second conductive via extending through a second substrate from an upper surface thereof to a lower surface thereof. The first substrate may be assembled on the second substrate such that the end portion of the first conductive via including the solder wettable layer thereon contacts the conductive metal opposite the second conductive via. The solder wettable layer may be formed of a material configured to provide a greater degree of wetting with the conductive metal than that of the second conductive via. For example, the solder wettable layer may be tin, tin silver, tin silver copper and/or tin bismuth.

DETAILED DESCRIPTION OF EMBODIMENTS OF THE INVENTION

Figure 1:
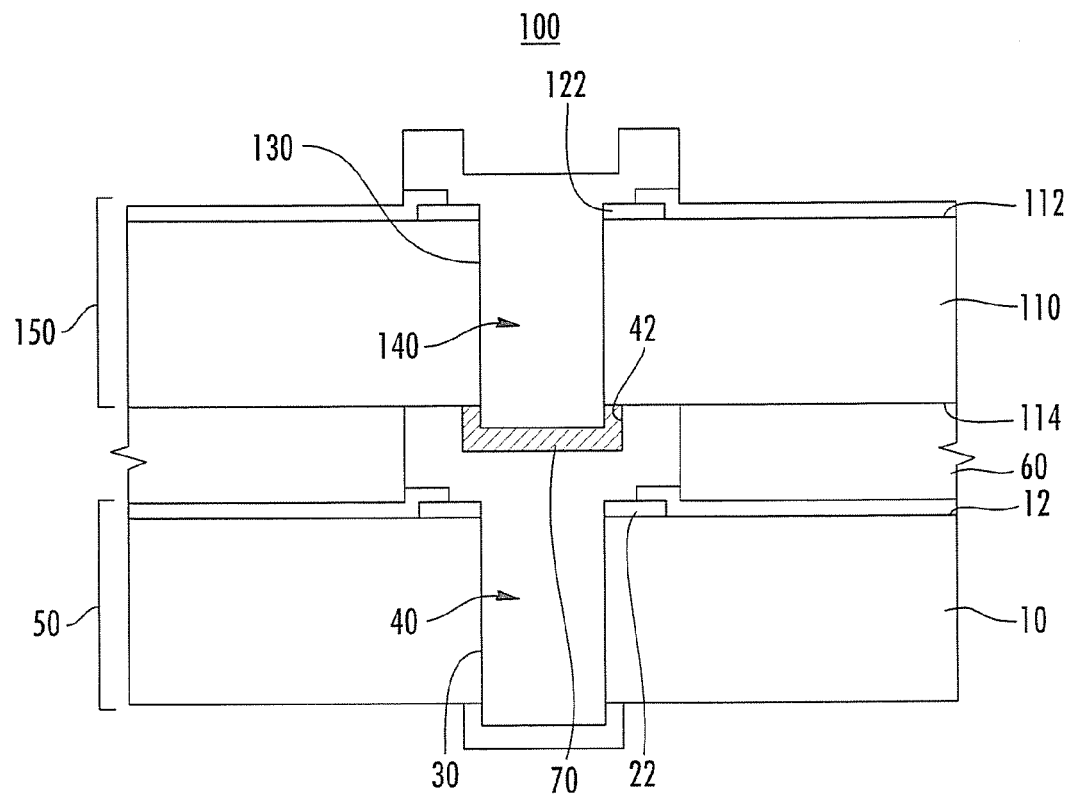
FIG. 1 is a cross-sectional view illustrating semiconductor device structures according to some embodiments of the present invention.

The present invention will now be described more fully hereinafter with reference to the accompanying drawings, in which embodiments of the invention are shown. This invention, however, may be embodied in many different fauns and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be turned a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Some embodiments of the present invention may arise from a realization that when a first conductive via extending through a first substrate contacts a metal bump (such as solder) on a second conductive via that extends through a second substrate, the metal bump may be pushed by the first conductive via such that the metal bump spreads beyond the contact surface of the second conductive via, which may cause operational problems. Accordingly, some embodiments of the present invention provide a conductive via including a recess therein that is configured to contain a conductive metal, such as solder, when another conductive via is assembled thereon. Also, embodiments of the present invention provide a solder wettable layer on an end portion of a conductive via that provides greater wettability with a conductive metal, such as solder, to reduce and/or prevent the conductive metal from spreading beyond the contact surface of another conductive via.

FIG. 1 is a cross sectional view illustrating semiconductor device structure 100 in accordance with some embodiments of the present invention. As shown in FIG. 1, a first semiconductor chip 50 includes a first substrate 10 having a first opening 30 therein. A first conductive via 40 extends through the opening 30 in the first substrate 10. A second semiconductor chip 150 includes a second substrate 110 having a second opening 130 extending therethrough, and a second conductive via 140 extends through the second opening 130 to contact a conductive metal 70 on the first conductive via 40. The conductive metal 70 may be a solder material, such as tin (Sn), tin silver (SnAg), tin silver copper (SnAgCu), and/or tin bismuth (SnBi). The first conductive via 40 extends through a first conductive pad 22 on a surface of the first substrate 10, while the second conductive via 140 extends through a second conductive pad 122 on a surface of the second substrate 110. The first and second substrates 10 and 110 may include respective passivation layers 12 and 112 thereon, and may be connected by an insulating or adhesive film 60 therebetween. The contact pads 22 and 122 may be, but are not necessarily, in electrical contact with the respective conductive vias 40 and 140.

Figure 2:
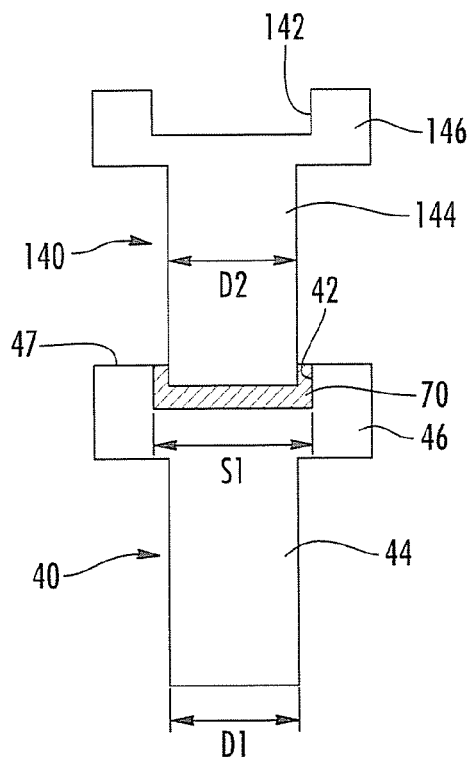
FIG. 2 is a cross-sectional view further illustrating the conductive via of FIG. 1.

FIG. 2 is a cross-sectional view further illustrating the conductive vias 40 and 140 of FIG. 1. As shown in FIG. 1, the first conductive via 40 includes a first body portion 44 and a first connecting portion 46. The first body portion 44 extends into the opening 30 in the substrate from an upper surface thereof, while the first connecting portion 46 laterally extends along the upper surface of the substrate 10. The first connecting portion 46 includes a recess 42 opposite the upper surface of the first substrate 10. Likewise, the second conductive via 140 includes a second body portion 144 extending into the opening 130 in the second substrate 110, and a second connecting portion 146 laterally extending along the upper surface of the second substrate 110. The second connecting portion 146 also includes a recess 142 therein opposite the upper surface of the second substrate 110.

As shown in FIGS. 1 and 2, the recesses 42 and 142 are respectively defined within the connecting portions 46 and 146, and do not extend beneath the upper surfaces of the respective substrates 10 and 110. In other words, the recesses 42 and 142 may extend in to the respective connecting portions 46 and 146 to a depth that is less than the respective thicknesses of the connecting portions 46 and 146 on the surfaces of the substrates 10 and 110. For example, the recesses 42 and 142 may extend into the respective connecting portion 46 and 146 to a depth of about 5 micrometers (μm) to about 30 μm or more. A conductive metal having a ductility greater than that of the conductive vias 40 and 140, such as solder, may be formed in the recesses 42 and/or 142. For example, the conductive metal 70 may be formed in the recess 42 in the first conductive via 40, and the body portion 144 of the second conductive via 140 may contact the conductive metal 70 to electrically connect the second conductive via 140 to the first conductive via 140.

Still referring to FIGS. 1 and 2, the width or diameter 51 of the first recess 42 is greater than that of the width or diameter D2 of the second body portion 144. However, in some embodiments, the width or diameter S1 of the first recess 42 in the first conductive via 40 may be narrower than or substantially equal to the width or diameter D2 of the second body portion 144 of the second conductive via 140.

As shown in FIG. 1, an end portion of the second conductive via 140 extends completely through the second substrate 110 and protrudes from a lower surface thereof to contact the conductive metal 70 in the first recess 42 of the first conductive via 40. As such, the end portion of the second conductive via 140 pushes the conductive metal 70, which may spread outside of the recess 42 in the first conductive via 40. Accordingly, as shown in FIG. 2, the first conductive via 40 includes a barrier portion 47 configured to reduce and/or prevent the conductive metal 70 from spreading therebeyond. When there is a relatively fine pitch between the first conductive via 40 and the second conductive via, the barrier portion 47 may reduce and/or prevent an electrical short by reducing the spreading of the conductive metal 70 from beyond the edges of the first conductive via 40. Also, the barrier portion 47 may improve the reliability of the junction by increasing the contact area between the conductive metal 70 and the conductive vias 40 and 140.

The conductive vias 40 and/or 140 may be formed of gold (Au), silver (Ag), copper (Cu), and/or platinum (Pt). Also, in some embodiments, a metal layer may be formed on the protruding end of the portion of the second conductive via 140 to contact the conductive metal 70, as illustrated in greater detail in FIG. 10. For example, when the conductive metal 70 is solder, the metal layer on the end portion of the second conductive via 140 may be material having a greater wettability with solder than that of the second conductive via 140, such as tin (Sn), nickel (Ni), copper (Cu), and/or silver (Ag). Also, the protruding end portion of the second conductive via 140 may define a truncated spherical shape having a diameter greater than the diameter D2 of the second body portion 144.

The first and second semiconductor chips 50 and 150 may be mounted on a circuit board, such as a printed circuit board (PCB). The first chip 50 may be mounted on the circuit board using a first adhesive film (not shown), and the second semiconductor chip 150 may be mounted on the first chip 50 using a second adhesive film 60.

Figure 3:
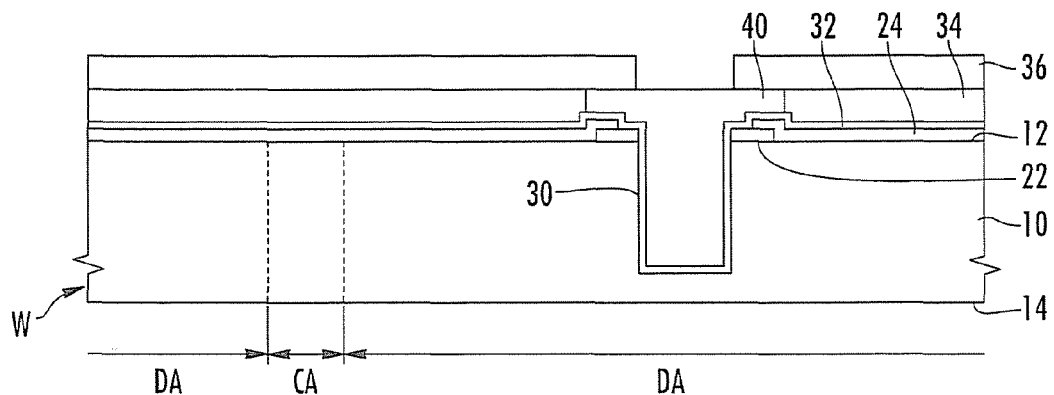
FIGS. 3-5 are cross sectional views illustrating methods of fabricating the microelectronic device structure of FIG. 1 according to some embodiments of the present invention.
Figure 4:
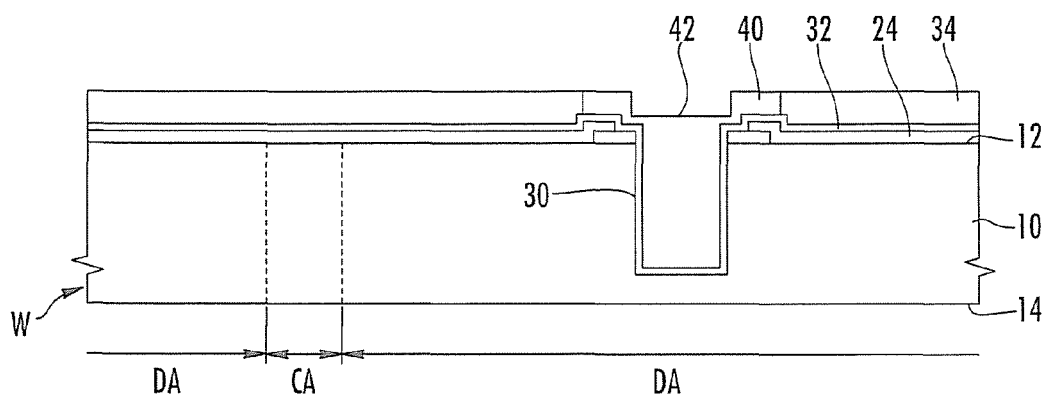
Figure 5:
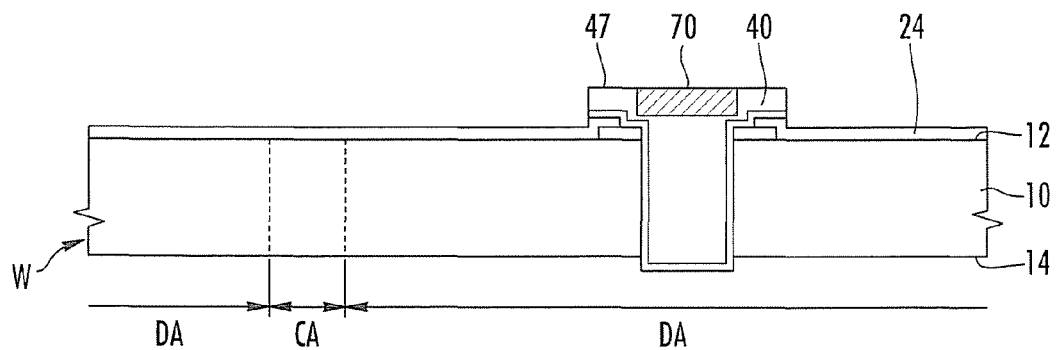

FIGS. 3-5 illustrate operations for fabricating the semiconductor device structure of FIG. 1. As shown in FIG. 3, an opening 30 is formed extending into a device area (DA) of a substrate 10 from an upper surface 12 thereof. The opening 30 extends through a contact pad 22 and a passivation layer 24 on the upper surface 12 of the substrate 10. A seed layer 32 is formed on the upper surface 12 and in the opening 30 in the substrate 10, and a mask layer 34 is formed on portions of the seed layer 32 outside the opening 30 in the substrate 10. An electrolytic plating process is used to form a conductive via 40 in the opening 30 and on portions of the upper surface 12 exposed by the mask 34 based on the electrolytic reaction with the exposed portion of the seed layer 32. A second mask layer 36 is formed on the upper surface 12 of the substrate 10 to expose a part of the laterally extending portion of the conductive via 40.

Referring now to FIG. 4, the exposed part of the conductive via 40 is etched using the second mask layer 36 as an etch mask to define a recess 42 in the laterally extending portion of the conductive via 40. The recess 42 may extend into the conductive via to a depth of at least about 5 micrometers (μm) to about 30 μm; however, in the embodiments of FIGS. 3-5, the recess 42 is confined within the laterally extending portion of the conductive via 40, and does not extend beneath the upper surface 12 of the substrate 10. In other words, the depth of the recess 42 is less than a thickness of the laterally extending portion of the conductive via 40. The second mask layer 36 is also removed. For example, the second mask layer 36 may be removed during the etching process and/or by a subsequent process, such as chemical mechanical polishing (CMP). As shown in FIG. 4, the recess 42 in the laterally extending portion of the conductive 40 is wider than the opening 30 in the substrate 10 through which the conductive 40 extends. However, it is to be understood that, in some embodiments, the recess 42 may be narrower than or substantially equal in width to the opening 30 in the substrate 10.

Referring now to FIG. 5, the first mask layer 34 is removed, and a conductive metal 70 is formed in the recess 42 in the conductive via 40. The conductive metal 70 may be deposited by plating, printing and/or other deposition method. The conductive metal 70 may be a solder material, such as tin (Sn), lead tin (PbSn), tin silver (SnAg), tin silver copper (SnAgCu), and/or tin bismuth (SnBi). The conductive metal 70 has a ductility greater than that of the conductive via 40. A surface of the laterally extending portion of the conductive via 40 outside of the recess 42 defines a barrier portion 47 that is configured to reduce and/or prevent the conductive metal 70 from spreading beyond the edges of the laterally extending portion of the conductive via 40. The lower surface 14 of the substrate 10 is recessed, for example, by a chemical-mechanical polishing (CMP) process, to expose an end portion of the conductive via 40. The wafer W may then be cut in the cutting area CA and separated into individual semiconductor chips for further assembly into a multi-chip package.

Although discussed above in FIGS. 3-5 with reference to particular methods of fabrication, it is to be understood that fabrication of one or more of the layers discussed in FIGS. 3-5 may be implemented using other methods which are known to those of ordinary skill in the art. For example, rather than forming the conductive via 40 in the opening 30 using a plating process, a conductive layer may be formed along the opposing sidewalls and the surface therebetween in the opening 30 by a deposition process, and may be subsequently patterned to define the conductive via 40. Furthermore, additional layers, such as layers configured to provide a greater wettability to solder, may be formed in the opening 30 prior to formation of the conductive via 40 therein.

Figure 6:
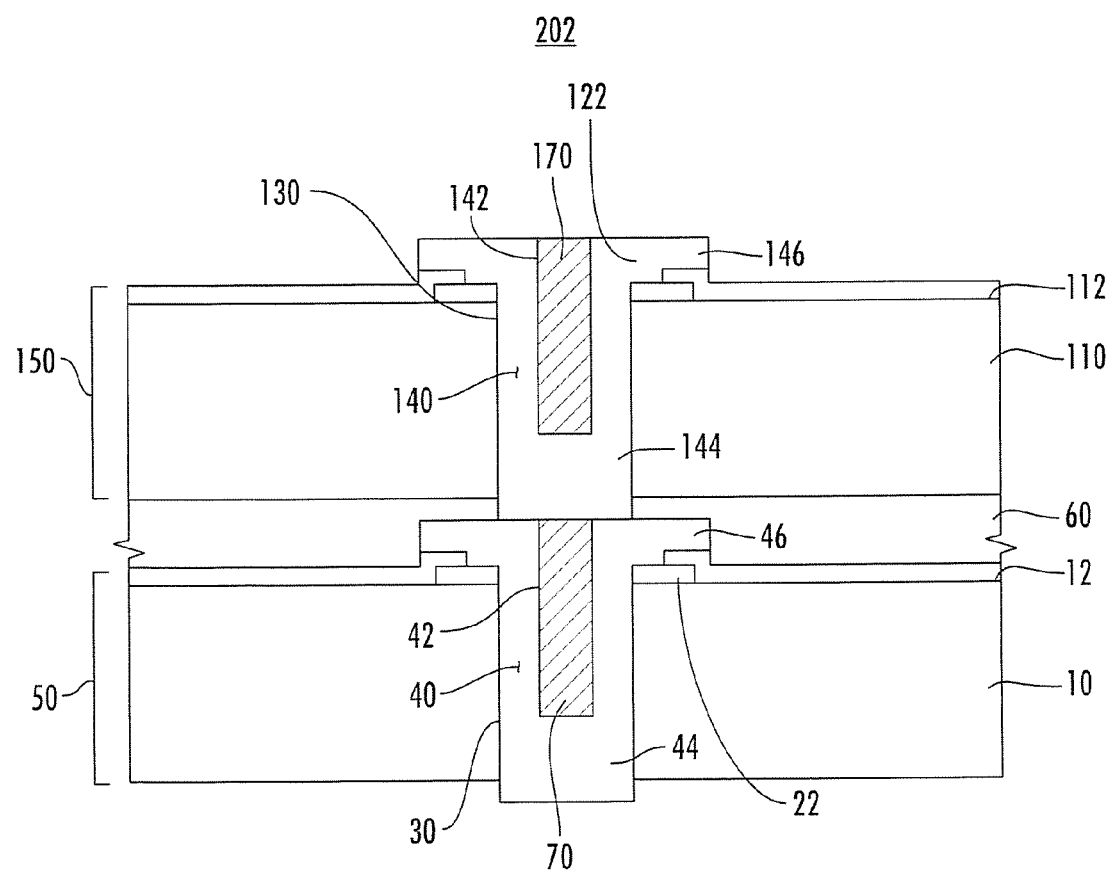
FIG. 6 is a cross-sectional view illustrating microelectronic device structures according to other embodiments of the present invention.

FIG. 6 is cross-sectional view illustrating a semiconductor device structure 202 in accordance with other embodiments of the present invention. As shown in FIG. 6 the stacked semiconductor device structure 202 includes the first and second semiconductor chips 50 and 150 of FIG. 1 connected by the insulating or adhesive film 60 therebetween. The first chip 50 includes an opening 30 extending through a contact pad 22 on an upper surface 12 of a substrate 10, while the second chip 150 includes an opening 130 extending through a contact pad 122 on an upper surface 112 of a substrate 110. A first conductive via 40 is formed extending through the first substrate 10, and a second conductive via 140 is formed extending through the second substrate 110 to contact the first conductive via 40. However, as shown in FIG. 6, the respective recesses 42 and 142 in the conductive vias 40 and 140 are narrower than the respective openings 30 and 130 in the substrates 10 and 110, and extend beyond the respective upper surfaces 12 and 112 of the substrates 10 and 110. In other words, the respective depths of the recesses 42 and 142 are greater than the respective thicknesses of the connecting portions 46 and 146 of the conductive vias 40 and 140. Accordingly, the conductive metals 70 and 170 formed in the respective recesses 42 and 142 may not spread beyond the laterally extending portions of the respective conductive vias 40 and 140. In particular, when the second conductive via 140 protrudes from a lower surface of the second substrate 110 to contact the laterally extending connecting portion 46 of the first conductive via 40, the conductive metal 70 in the recess 42 in the first conductive via 40 does not extend beyond edges of the laterally extending connecting portion 46. Thus, as discussed above, the potential for an electrical short may be reduced and/or prevented, and the reliability of the electrical contact between the first conductive plug 40 and the second conductive plug 140 may be improved. In some embodiments, the connecting portions 46 and/or 146 of the first and second conductive plugs 40 and 140 may include a barrier portion along the respective surfaces thereof that is configured to reduce and/or prevent the respective conductive layers 70 and/or 170 from spreading beyond the edges of the connecting portions 46 and/or 146.

Figure 7:
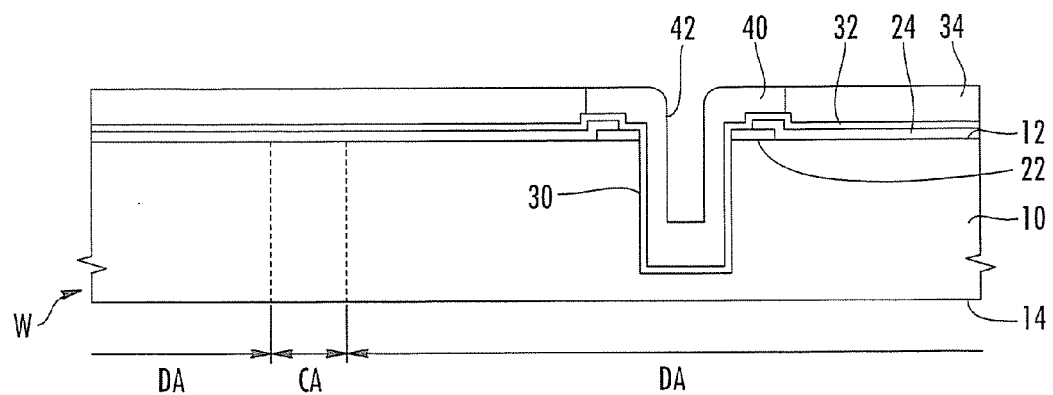
FIGS. 7-8 are cross-sectional views illustrating methods of fabricating the microelectronic device structures of FIG. 6 according to other embodiments of the present invention.
Figure 8:
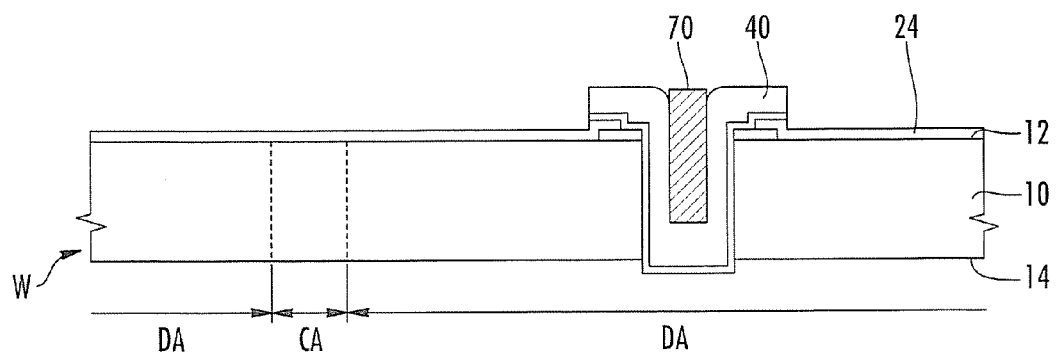

FIGS. 7 and 8 illustrate example operations for fabricating the semiconductor device structures of FIG. 6. Referring now to FIG. 7, an opening 30 is formed extending into a substrate 10 from an upper surface 12 thereof. The opening 30 extends through a contact pad 22 and a passivation layer 24 on the upper surface 12 of the substrate 10. A conductive via 40 is formed along opposing sidewalls and a bottom surface therebetween of the opening 30. The conductive via 40 includes a body portion in the opening 30 and a laterally extending portion on parts of the upper surface 12 of the substrate 10 that are exposed by a mask layer 34. As discussed above, the conductive via 40 may be formed by a deposition process, or by a plating process using a seed layer 32. A recess 42 is defined in the conductive via 40. The recess 42 has a width or diameter that is smaller than that of the opening 30 in the substrate 10. As shown in FIG. 7, the recess 42 extends into the conductive via 40 beyond the upper surface 12 of the substrate 10; however, in some embodiments, the recess 42 may be confined above the upper surface 12 of the substrate 10.

Referring now to FIG. 8, the mask layer 34 is removed, and a conductive metal 70, such as solder, is formed in the recess 42. The conductive metal 70 has a ductility greater than that of the conductive via 40, and may be deposited by plating, printing and/or other deposition method. The lower surface 14 of the substrate 10 is recessed, for example, by chemical mechanical polishing, to expose an end portion of the conductive via 40. The wafer W is then cut at the cutting area CA to provide individual semiconductor chips, which can be assembled into a multichip package, as discussed above.

Figure 9A:
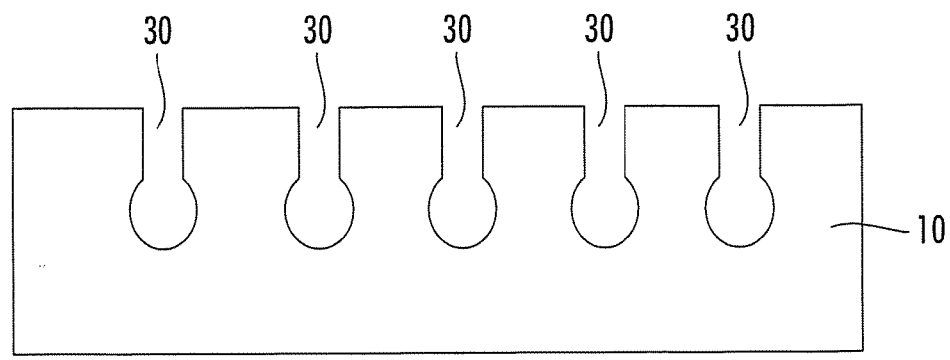
FIGS. 9A-9C are cross-sectional views illustrating methods of fabricating microelectronic device structures according to further embodiments of the present invention.
Figure 9B:
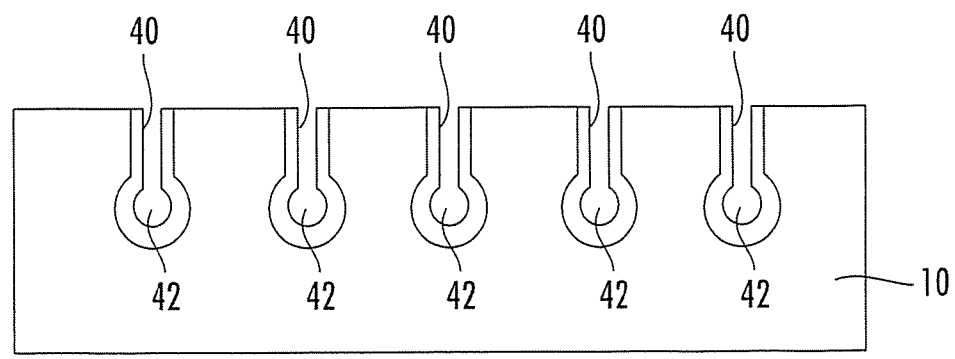
Figure 9C:
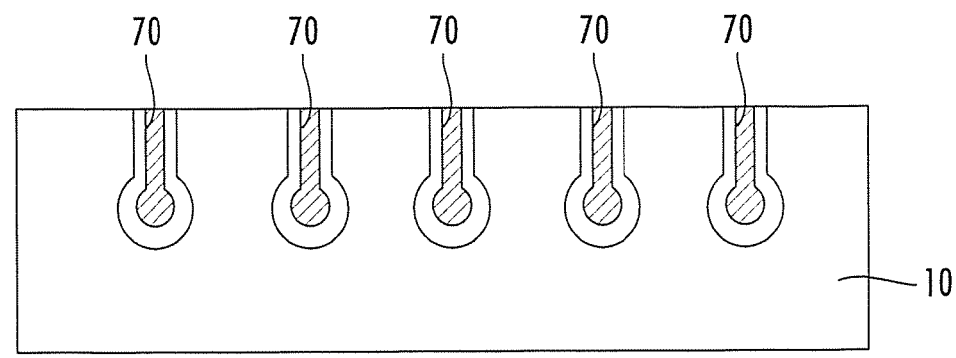

FIGS. 9A-9C illustrate example operations for forming the semiconductor device structures of FIG. 1 or 6 to include conductive vias having end portions that are greater in width or diameter than other portions thereof. Referring now to FIG. 9A, openings 30 are formed in a substrate 10 using a two-step etch process. In particular, the substrate 10 is anisotropically etched to define a main portion of the openings 30 respectively including opposing sidewalls and a surface therebetween. The respective surfaces of the openings 30 between the opposing sidewalls are then isotropically etched to define bottom portions having greater widths than the main portions thereof. For example, the bottom portions may respectively define a truncated spherical shape.

As shown in FIG. 9B, conductive plugs 40 are formed on the opposing sidewalls of the openings 30 and on the widened bottom portions. The conductive plugs 40 may be formed, for example, by depositing a seed layer on the opposing sidewalls of the openings 30 and the surfaces therebetween using a plating process. As such, recesses 42 may be defined in the conductive vias 40. Alternatively, the openings 30 may be substantially filled by the conductive vias 40 using the plating process, and the recesses 42 may be defined in the conductive vias 40 in a subsequent etching step, for example, as illustrated in FIGS. 3-5.

As shown in FIG. 9C, a conductive metal 70 is formed in the recesses 42 in the conductive vias 40. The conductive metal 70 may be solder, and may be formed by plating, printing, and/or other deposition process. Due to the shape of the opening, both the conductive vias 40 and/or the recesses 42 may have end portions that define a truncated spherical shape in some embodiments, to provide a Sphere-Shaped Recessed Channel Access Transistor (S-RCAT). A back side of the substrate 10 may then be recessed to expose the end portions of the conductive vias 40, as discussed above.

Figure 10A:
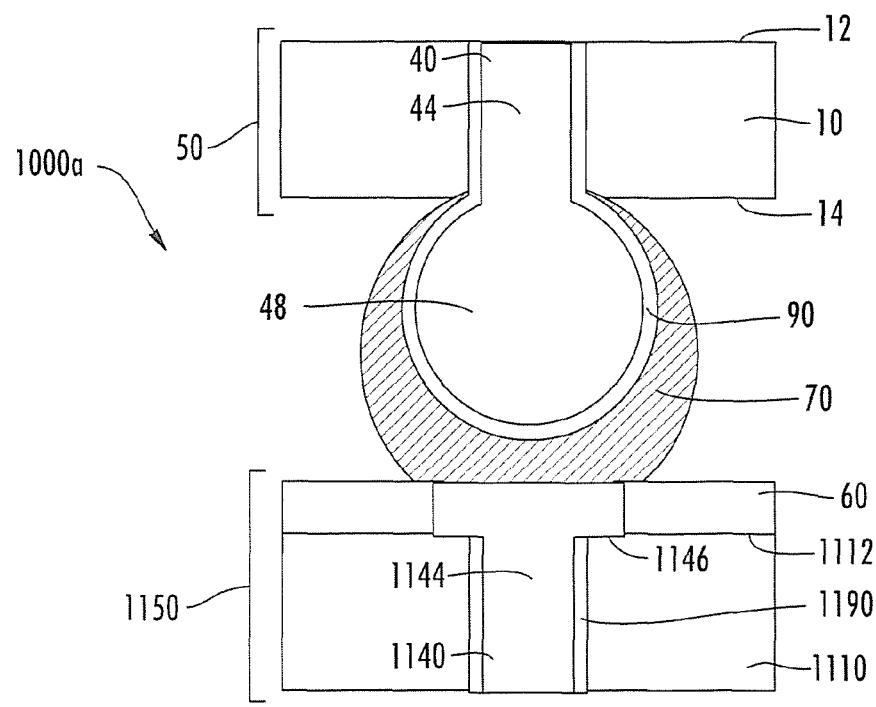
FIGS. 10-10B are cross sectional views illustrating microelectronic device structures according to still further embodiments of the present invention.
Figure 10B:
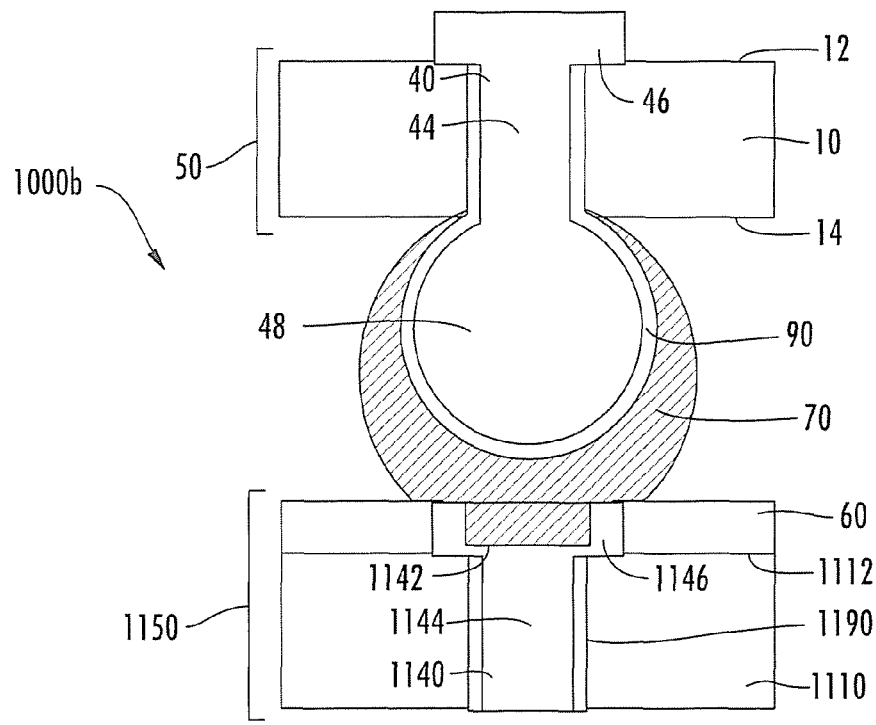

FIGS. 10A and 10B illustrate semiconductor device structures according to further embodiments of the present invention. Referring now to FIG. 10A, a structure 1000a includes a first semiconductor chip 50 where a first conductive via 40 extends through a first substrate 10. The first conductive via 40 includes a first body portion 44 extending into the substrate 10 from upper surface 12 thereof, and an end portion 48 below the upper surface 12 of the substrate 10. The end portion 48 has a greater width or diameter than the body portion 44. A solder wettable layer 90 is provided on the end portion 48 of the first conductive via 40. The solder wettable layer 90 is formed of a material having a greater wettability with a conductive metal, such as solder, than that of the conductive via 40. For example, the solder wettable layer 90 may be a metal layer such as tin (Sn), tin silver (SnAg), tin silver copper (SnAgCu), and/or tin bismuth (SnBi).

Still referring to FIG. 10A, the conductive via 40 extends through the substrate 10 such that the end portion 48 defines a protrusion that protrudes form a lower surface 14 of the substrate 10 opposite the upper surface 12. The conductive metal 70 is provided on the protruding end portion 48 of the conductive via 40. The conductive metal 70 has a ductility greater than that of the conductive via 40, and may be solder in some embodiments. A second semiconductor chip 1150 including a second substrate 1110 and a second conductive via 1140 extending therein is electrically connected to the first conductive via 40 by the conductive metal 70. More particularly, the conductive metal 70 may be formed on a laterally extending connecting portion 1146 of the second conductive via 1140, and the first substrate 10 may be assembled on the second substrate 1110 such that the end portion 48 of the first conductive via 40 including the solder wettable layer 90 thereon contacts the conductive metal 70 opposite the second conductive via 1140. The solder wettable layer 90 is formed of a material configured to provide a greater degree of wetting with the conductive metal 70 than the second conductive via 140. Also, the end portion 48 of the first conductive via 40 protruding from the lower surface 14 of the first substrate 10 may have a greater surface area than the laterally extending portion 1146 of the second conductive via 1140 in contact with the conductive metal 70. For example, as shown in FIG. 10, the end portion 48 of the first conductive via 40 defines a truncated spherical shape having a greater diameter than that of the body portion 44. As such, due to the greater wettability of the solder wettable layer 90 surrounding the end portion 48 of the first conductive via 40 and/or the greater surface area provided by the end portion 48 of the first conductive via 40, the conductive metal 70 may wet to the end portion 48 of the first conductive via 40 without spreading beyond the edges of the laterally extending connecting portion 1146 of the second conductive via 1144. An insulating layer 60 may be provided on the upper surface 1112 of the second substrate 1110 adjacent to the connecting portion 1146 of the second conductive via 140, which laterally extends along the surface 1112 of the second substrate 1110. In some embodiments, the second conductive via 1140 may also include a solder wettable layer 1190 on sidewalls and/or an end portion (not shown) thereof.

Also, as shown in FIG. 10B, the structure 1000b may include a first conductive via 40 including a connecting portion 46 laterally extending along the upper surface 12 of the substrate 10. Such a laterally extending connecting portion 46 may include a recess therein, as discussed above. For example, the recess may be confined within the connecting portion (as shown in FIGS. 1 and 2), or may further extend into the body portion 44 of the first conductive via beyond the upper surface 12 of the substrate 10 (as shown in FIG. 6). Likewise, the second conductive via 1140 may include a similar recess 1142 in the laterally extending connecting portion 1146 such that, when the first conductive via 40 contacts the conductive metal 70, the conductive metal 70 is pushed into the recess 1142 in the laterally extending connecting portion 1146 of the second conductive via 1140. Such a structure may further reduce the possibility that the conductive metal 70 spreads beyond the connecting portion 1146 of the second conductive via 1140 when the first substrate 10 is assembled on the second substrate 1110.

Figure 11A:
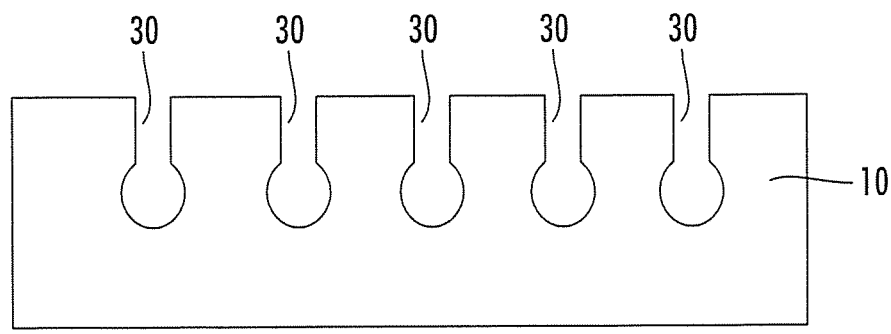
FIGS. 11A-11C are cross-sectional views illustrating methods of fabricating microelectronic device structures of FIG. 10 according to still further embodiments of the present invention.
Figure 11B:
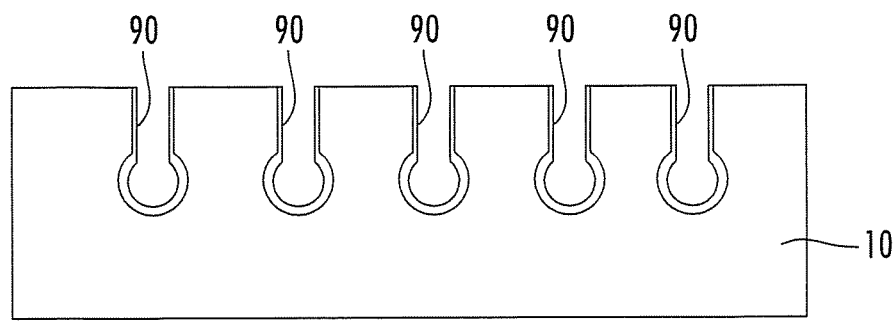
Figure 11C:
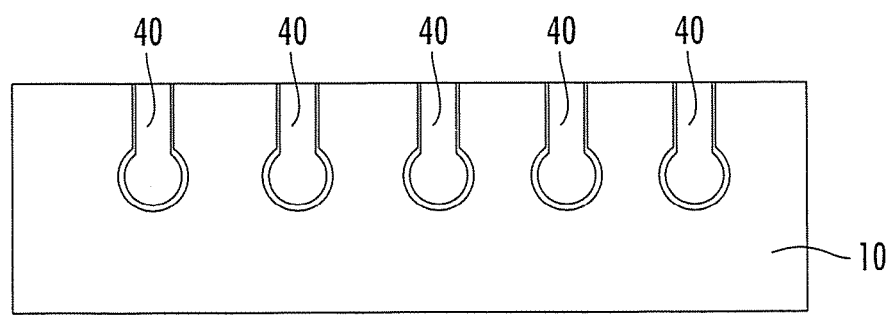

FIGS. 11A-11C illustrate example operations for fabricating the semiconductor device structure of FIG. 10. Referring now to FIG. 11A, openings 30 having opposing sidewalls and a bottom portion having a greater width than portions between the opposing sidewalls are formed in the substrate 10, for example, using an S-RCAT technique. The bottom portion of the opening between the opposing sidewalls may define a truncated spherical shape having a greater diameter than the portions thereof between the opposing sidewalls.

As shown in FIG. 11B, a solder wettable layer 90 is formed in the openings 30 along the opposing sidewalls thereof and on the surface therebetween. As discussed above, the solder wettable layer 90 may be tin, tin silver, tin silver copper, and/or tin bismuth. As shown in FIG. 11C, a conductive metal layer is formed in the openings 30 in the substrate 10 to define conductive vias 40. As such, the conductive vias 40 have end portions that are wider than the body portions thereof between the opposing sidewalls of the openings 30, and include the solder wettable layer 90 on the end portions. A lower surface of the substrate 10 may be subsequently removed to expose the end portions of the conductive vias 40, such that the solder wettable layers 90 thereon may provide a greater degree of wetting to solder and/or other conductive metals when assembled on another substrate to provide a multi-chip package with three-dimensional integration.

Figure 12:
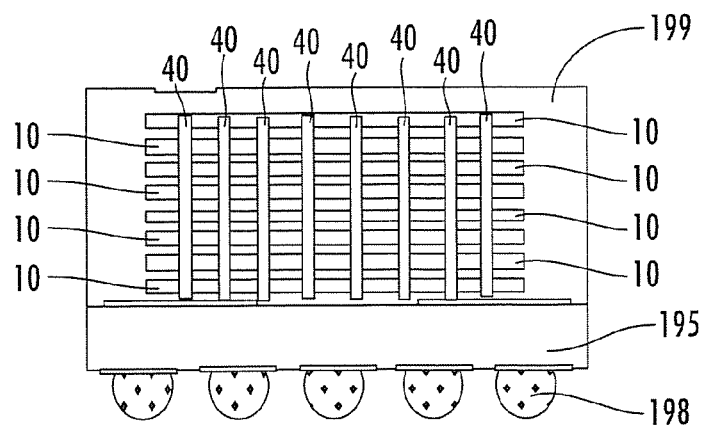
FIG. 12 is a cross-sectional view illustrating a multi-chip package including microelectronic device structures according to some embodiments of the present invention.

FIG. 12 illustrates a multi-chip package including semiconductor device interconnection structures according to some embodiments of the present invention. In particular, as shown in FIG. 12, multiple substrates 10 are stacked in a three-dimensional arrangement and are interconnected by conductive vias 40 extending through the substrates 10. The conductive vias 40 and the interconnections therebetween may be provided according to any of the embodiments illustrated in FIGS. 1-11 above. A non-conductive mold layer 199 provides support for the stacked substrates 10 for assembly on a printed circuit board 195. Conductive bumps 198, such as solder bumps, provide further electrical connection to the multichip package 1200.

Figure 13:
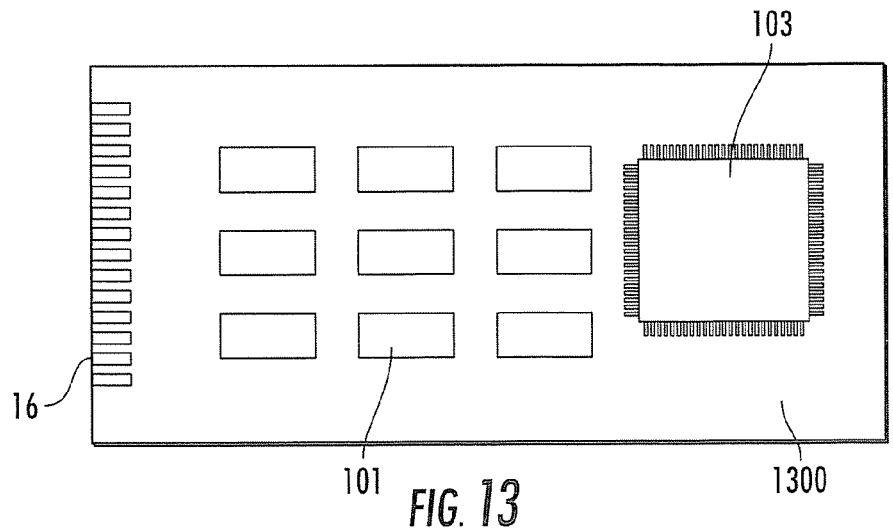
FIG. 13 is a plan view illustrating a memory module including microelectronic device structures according to some embodiments of the present invention.

FIG. 13 illustrates a memory module 1300 according to some embodiments of the present invention. As shown in FIG. 13, the memory module 1300 includes a processor 103, such as a memory controller, and a plurality of I/O pins 16. The memory module 1300 further includes a plurality of memory chips 101. One or more of the memory chips 101 may be implemented by a multi-chip package, such as the multichip package 1200 of FIG. 12, and/or may otherwise employ any of the semiconductor device interconnection structures discussed above with reference to FIGS. 1-11.

Figure 14:
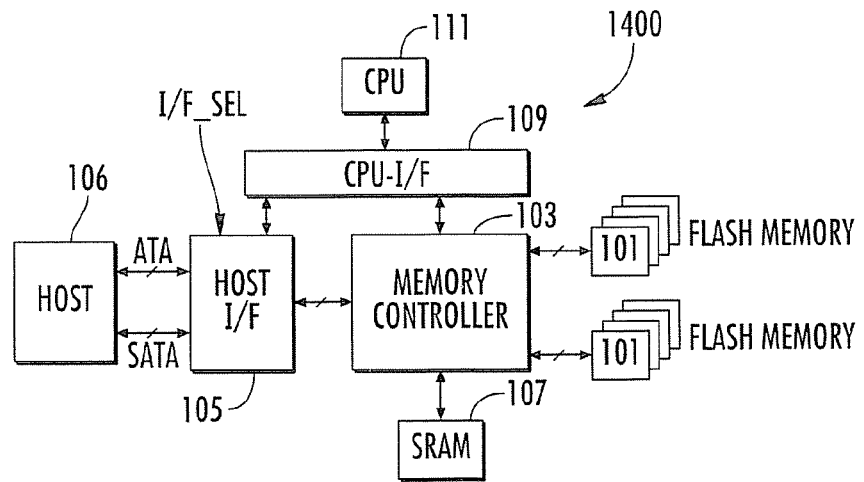
FIG. 14 is a block diagram illustrating a memory device including microelectronic device structures according to some embodiments of the present invention.

FIG. 14 is a block diagram illustrating a memory system 1400 in accordance with some embodiments of the present invention. As shown in FIG. 14, the memory system 1400 includes a plurality of flash memory devices 101, a memory controller 103, a static RAM (SRAM) unit 107, a central processing unit (CPU) 111, a CPU interface 109, a host interface 105, and a host 106. One or more of the elements illustrated in FIG. 14 may be implemented using semiconductor device interconnection structures as described above with reference to FIGS. 1-11. For example, interconnections between one or more of the flash memory devices 101 may be provided according to any of the embodiments illustrated in FIGS. 1-11 above.

Figure 15:
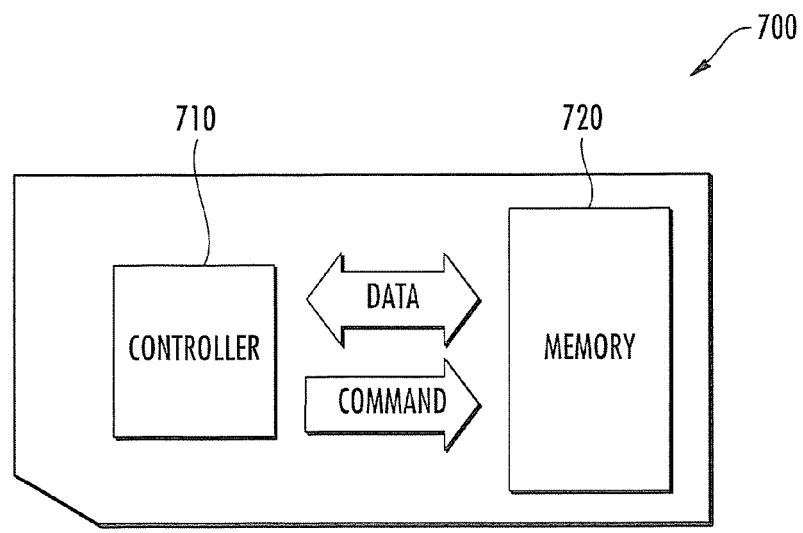
FIG. 15 is a block diagram illustrating a memory card including microelectronic device structures according to some embodiments of the present invention.

FIG. 15 illustrates a memory card 700 in accordance with some embodiments of the present invention. The memory card 700 includes a controller 701 and a memory 720, one or both of which may employ semiconductor device interconnection structures as discussed above with reference to FIGS. 1-11. For example, both the controller 710 and the memory 720 may be provided in a multi-chip package, such as the multi-chip package 1200 of FIG. 12. The memory card 700 may be, for example, a multimedia card (MMC) or a secure digital card (SD).

Figure 16:
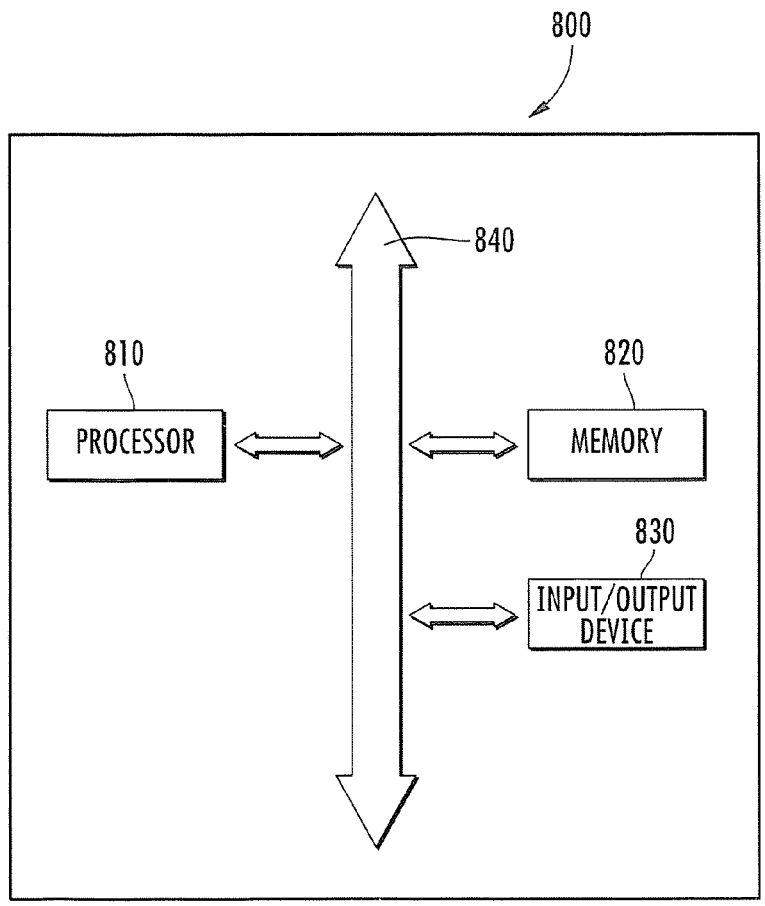
FIG. 16 is a block diagram illustrating a system including microelectronic device structures according to some embodiments of the present invention.

FIG. 16 is a block diagram illustrating a system according to some embodiments of the present invention. As shown in FIG. 16, the system 800 includes a processor 810, a memory 820, one or more input/output devices 830, and a bus 840 configured to provide communication between the devices 810, 820 and/or 830. One or more of the elements illustrated in FIG. 16 may be assembled and/or connected using any of the semiconductor device structures discussed above with reference to FIGS. 1-11.

Embodiments of the present invention can be employed in electronic devices such as mobile phones, MP3 players, navigation systems, solid state drives (SSD), and/or household appliances. The memory devices described herein may be one of a number of memory devices including, but not limited to, flash memory, DRAM, PRAM, and/or other memory types.

Many alterations and modifications may be made by those having ordinary skill in the art, given the benefit of the present disclosure, without departing from the spirit and scope of the invention. Therefore, it must be understood that the illustrated embodiments have been set forth only by way of example, and the present disclosure should not be taken as limiting the invention. In other words, while described herein with reference to specific embodiments, the present invention is not limited to such embodiments, and is defined by the following claims.

That which is claimed:

1. A microelectronic device structure, comprising:
   a substrate;
   a conductive via comprising a conductive body portion extending into the substrate from an upper surface thereof and a conductive connecting portion on top of the body portion and laterally extending along the upper surface of the substrate, the connecting portion having a width greater than the body portion and including a recess therein in a top surface thereof opposite the body portion, the connecting portion further including a barrier portion on the top surface of the connecting portion outside of the recess such that the barrier portion is elevated relative to a bottom of the recess; and
   a conductive metal in the recess, the conductive metal comprising a material having a ductility greater than that of the conductive via,
   wherein the recess is confined within the connecting portion of the conductive via and does not extend into the body portion thereof, and wherein the barrier portion is configured to prevent the conductive metal in the recess from extending beyond the barrier portion when the connecting portion is in contact with a second conductive via.

2. The structure of claim 1, wherein the recess extends into the connecting portion of the conductive via to a depth of about 5 micrometers (μm) to about 30 μm.

3. The structure of claim 1, wherein the recess defines an opening wider than that of an opening in the substrate through which the body portion of the conductive via extends.

4. The structure of claim 1, wherein the recess defines an opening narrower than that of an opening in the substrate through which the body portion of the conductive via extends.

5. The structure of claim 1, wherein the body portion extends through the substrate and further comprises a protrusion that protrudes from a lower surface of the substrate opposite the upper surface, and further comprising:
   a metal layer on the protrusion, the metal layer comprising a material having a greater wettability with solder than that of the protrusion.

6. The structure of claim 5, wherein the metal layer comprises at least one of tin (Sn), nickel (Ni), copper (Cu), and silver (Ag).

7. The structure of claim 5, wherein the protrusion comprises a spherical shape having a diameter greater than that of the body portion.

8. The structure of claim 2, wherein the conductive via comprises a first conductive via extending into a first substrate, and further comprising:
   the second conductive via including a second body portion extending through a second substrate from an upper surface thereof to a lower surface thereof opposite the upper surface, wherein the second substrate is stacked on the first substrate, and wherein the second body portion protrudes from the lower surface of the second substrate to contact the conductive metal in the recess in the connecting portion of the first conductive via.

9. The structure of claim 8, wherein the conductive metal in the recess extends outside of the recess but does not extend beyond the barrier portion when in contact with the second body portion of the second conductive via.

10. The structure of claim 8, wherein the second body portion of the second conductive via has a width smaller than that of the recess and extends at least partially into the recess in the first conductive via.

11. The structure of claim 8, wherein the second body portion of the second conductive via has a width greater than that of the recess in the first conductive via.

12. A multi-chip module comprising the first and second substrates of claim 8, wherein the first and second substrates are sequentially stacked on a module substrate.

13. A system comprising the multi-chip module of claim 12, and further comprising:
   a processor;
   an input/output device; and
   a bus configured to provide communication between the multi-chip module, the processor, and the input/output device.

14. A memory card comprising the first and second substrates of claim 8, wherein the first and second substrates are sequentially stacked on a module substrate.

15. A microelectronic device structure, comprising:
- a first substrate and a second substrate stacked thereon;
- a first conductive via comprising a first conductive body portion extending into the first substrate from an upper surface thereof and a conductive connecting portion on top of the body portion and laterally extending along the upper surface of the first substrate, the connecting portion having a width greater than the first body portion and including a recess therein in a top surface thereof opposite the first body portion, the connecting portion further including a barrier portion on the top surface of the connecting portion outside of the recess such that the barrier portion is elevated relative to the recess;
- a conductive metal in the recess, the conductive metal comprising a material having a ductility greater than that of the first conductive via;
- a second conductive via comprising a second conductive body portion extending through the second substrate from an upper surface thereof and a conductive end portion comprising a protrusion that protrudes from a lower surface of the second substrate opposite the upper surface of the second substrate to contact the conductive metal in the recess in the connecting portion of the first conductive via, the end portion having a greater width than the second body portion; and
- a solder wettable layer on the end portion of the second conductive via, the solder wettable layer comprising a material having a greater wettability with the conductive metal than that of the end portion of the second conductive via and/or the connecting portion of the first conductive via.

16. The structure of claim 15, wherein the protrusion of the second conductive via comprises a greater surface area than the connecting portion of the first conductive via in contact with the conductive metal.

17. The structure of claim 15, wherein the solder wettable layer comprises at least one of tin (Sn), tin silver (SnAg), tin silver copper (SnAgCu), and tin bismuth (SnBi).

18. The structure of claim 15, wherein the end portion comprises a spherical shape having a greater diameter than that of the second body portion.

19. The structure of claim 15, wherein the recess is confined within the connecting portion and does not extend into the first body portion of the first conductive via.

20. The structure of claim 15, wherein the recess in the connecting portion further extends into the first body portion of the first conductive via beyond the upper surface of the substrate.

21. A method of fabricating a microelectronic device, the method comprising:
- forming a first conductive via including a first conductive body portion extending into a substrate from an upper surface thereof and a conductive connecting portion on top of the body portion and laterally extending along the upper surface of the substrate, the connecting portion having a width greater than the first body portion and including a recess therein in a top surface thereof opposite the first body portion, wherein the recess is confined within the connecting portion of the first conductive via and does not extend into the first body portion thereof, and wherein the connecting portion further including a barrier portion on the top surface of the connecting portion outside of the recess such that the barrier portion is elevated relative to a bottom of the recess;
- forming a conductive metal in the recess, the conductive metal comprising a material having a ductility greater than that of the first conductive via;
- forming a second conductive via including a second conductive body portion extending through a second substrate from an upper surface thereof to a lower surface thereof opposite the upper surface, wherein the second body portion protrudes from the lower surface; and
- assembling the second substrate on the first substrate such that the second body portion protruding from the lower surface of the second substrate contacts the conductive metal in the recess in the connecting portion of the first conductive via in the first substrate,
- wherein the conductive metal in the recess extends outside of the recess when in contact with the second body portion of the second conductive via but does not extend beyond the barrier portion.

22. The method of claim 21, wherein the recess extends into the connecting portion of the conductive via to a depth of about 5 micrometers ($\mu$m) to about 30 $\mu$m.

23. The method of claim 21, wherein forming the first conductive via comprises:
- forming an opening in the first substrate;
- forming a conductive layer in the opening and on the upper surface of the substrate to define the first conductive via including the first body portion in the opening and the connecting portion extending along the upper surface of the first substrate;
- forming a mask on the connecting portion of the first conductive via to expose at least a part thereof; and
- etching the part of the connecting portion of the first conductive via exposed by the mask to define the recess therein.

24. The method of claim 23, wherein forming the recess comprises forming the recess in the connecting portion to define an opening wider than that of the opening in the substrate through which the first body portion extends.

25. The method of claim 23, wherein forming the first conductive via further comprises forming a metal layer in the opening prior to forming the conductive layer therein, the metal layer comprising a material having a greater wettability to solder than that of the conductive layer.

26. A method of fabricating a microelectronic device, the method comprising:
- forming a first conductive via comprising a first conductive body portion extending into a first substrate from an upper surface thereof and a conductive connecting portion on top of the body portion and laterally extending along the upper surface of the first substrate, the connecting portion having a width greater than the first body portion and including a recess therein in a top surface thereof opposite the first body portion, the connecting portion further including a barrier portion on the top surface of the connecting portion outside of the recess such that the barrier portion is elevated relative to a bottom of the recess;
- forming a conductive metal in the recess, the conductive metal comprising a material having a ductility greater than that of the first conductive via;
- forming a second conductive via comprising a second conductive body portion extending through a second substrate from an upper surface thereof to a lower surface thereof opposite the upper surface and an end portion protruding from the lower surface of the second substrate, the end portion having a greater width than the second body portion;
- forming a solder wettable layer on the end portion, the solder wettable layer comprising a material having a greater wettability with the conductive metal than that of the end portion; and assembling the second substrate on the first substrate such that the end portion of the second conductive via including the solder wettable layer thereon contacts the conductive metal in the recess in the connecting portion of the first conductive via,
wherein the conductive metal in the recess extends outside of the recess but does not extend beyond the barrier portion when in contact with the second body portion of the second conductive via.

27. The method of claim 26, wherein forming the second conductive via comprises:
removing a portion of the lower surface of the second substrate opposite the upper surface such that the end portion of the second conductive via including the solder wettable layer thereon protrudes from the lower surface of the second substrate; and
forming a second conductive metal on the end portion of the second conductive via, the second conductive metal having a ductility greater than that of the second conductive via.

28. The method of claim 26, wherein forming the second conductive via and the solder wettable layer comprises:
forming an opening including opposing sidewalls and a surface therebetween in the second substrate;
forming the solder wettable layer in the opening along the opposing sidewalls thereof and the surface therebetween;
forming a conductive layer on the solder wettable layer in the opening.

29. The method of claim 28, wherein forming the opening in the second substrate comprises forming the opening such that the surface of the opening between the opposing sidewalls defines a spherical shape having a greater diameter than portions thereof between the opposing sidewalls.

30. The method of claim 26, wherein the solder wettable layer comprises at least one of tin (Sn), tin silver (SnAg), tin silver copper (SnAgCu), and tin bismuth (SnBi).

* * * * *